United States Patent
Kirschner et al.

(10) Patent No.: US 10,249,579 B2
(45) Date of Patent: Apr. 2, 2019

(54) ACTIVE SHIELD FOR PROTECTING A DEVICE FROM BACKSIDE ATTACKS

(71) Applicant: Nuvoton Technology Corporation, Hsin-chu (TW)

(72) Inventors: Yuval Kirschner, Even Yehuda (IL); Arnon Sharlin, Herut (IL)

(73) Assignee: NUVOTON TECHNOLOGY CORPORATION, Hsin-chu (TW)

( * ) Notice: Subject to any disclaimer, the term of this patent is extended or adjusted under 35 U.S.C. 154(b) by 21 days.

(21) Appl. No.: 15/496,017

(22) Filed: Apr. 25, 2017

(65) Prior Publication Data

US 2018/0308808 A1 Oct. 25, 2018

(51) Int. Cl.
*H01L 23/552* (2006.01)
*H01L 23/00* (2006.01)
*H01L 23/528* (2006.01)
*G06F 17/50* (2006.01)
*H01L 21/8234* (2006.01)

(52) U.S. Cl.
CPC ........ *H01L 23/576* (2013.01); *G06F 17/5077* (2013.01); *H01L 21/823475* (2013.01); *H01L 23/528* (2013.01)

(58) Field of Classification Search
CPC ....... H01L 2224/73265; H01L 23/5225; H01L 27/3272; H01L 31/02164
USPC .................................................. 257/659, 758
See application file for complete search history.

(56) References Cited

U.S. PATENT DOCUMENTS

| | | | |
|---|---|---|---|
| 7,154,161 B1 * | 12/2006 | Blaschke | H01L 21/76838 257/531 |
| 7,732,321 B2 * | 6/2010 | Walker | G06K 19/073 438/614 |
| 2004/0212017 A1 | 10/2004 | Mizuno et al. | |
| 2006/0214280 A1 * | 9/2006 | Mizuno | G06F 21/86 257/692 |
| 2009/0001821 A1 | 1/2009 | Walker et al. | |
| 2010/0193958 A1 * | 8/2010 | Watanabe | H01L 23/291 257/758 |
| 2010/0207256 A1 * | 8/2010 | Walker | G06K 19/07327 257/659 |
| 2013/0314121 A1 | 11/2013 | Mougin et al. | |
| 2016/0218071 A1 | 7/2016 | Nam et al. | |
| 2017/0186706 A1 * | 6/2017 | Guilley | H01L 23/576 |

* cited by examiner

*Primary Examiner* — Sheila V. Clark
(74) *Attorney, Agent, or Firm* — Kligler & Associates

(57) ABSTRACT

An electronic apparatus includes, a substrate, one or more routing layers, and an active shield layer. The substrate includes active devices. The routing layers are electrically connected to the active devices and are configured to route electrical signals to and from the active devices. The active shield layer is disposed within a routing layer nearest to the substrate, the active shield layer includes metallic traces configured conduct active-shield signals that provide an indication of an attack on the apparatus.

8 Claims, 3 Drawing Sheets

ACTIVE SHIELD FOR PROTECTING A DEVICE FROM BACKSIDE ATTACKS

FIELD OF THE INVENTION

The present invention relates generally to data security, and particularly to methods and systems for protecting an Integrated Circuit (IC) from backside attacks.

BACKGROUND OF THE INVENTION

Electronic devices, such as Integrated Circuits (ICs), may be subjected to various security attacks, in which an unauthorized party attempts to access confidential information processed or stored in the IC. Various techniques may be used to mitigate such attacks.

For example, U.S. Patent Application Publication 2009/0001821, whose disclosure is incorporated herein by reference, describes a system for protecting a chip with an integrated circuit disposed on a first surface. The system includes, disposed on the first surface, a first antenna, signal analyzer, chip controller and a signal generator which is operative to supply an outbound signal for transmission by the first antenna. A circuit arrangement, disposed on a second surface of the chip, including a shielding arrangement and a second antenna to receive the outbound signal.

U.S. Patent Application Publication 2013/0314121, whose disclosure is incorporated herein by reference, describes a method for detecting an attack, such as by laser, on an electronic microcircuit from a backside of a substrate. The method includes, forming the microcircuit on the semiconductor substrate, the microcircuit comprising a circuit to be protected against attacks, forming photodiodes between components of the circuit to protected, forming a circuit for comparing a signal supplied by each photodiode with a threshold value, and forming a circuit for activating a detection signal when a signal at output of one of the photodiodes crosses the threshold value.

U.S. Patent Application Publication 2016/0218071, whose disclosure incorporated herein by reference, describes an integrated circuit, including a detector circuit that includes a sensor configured to sense an alteration to a physical characteristic of a substrate and to generate an alarm signal indicating such alteration and a circuit configured to respond to the generation of the alarm signal by implementing countermeasures. A smart card may include such a circuit to counteract a backside attack.

SUMMARY OF THE INVENTION

An embodiment of the present invention that is described herein provides an electronic apparatus that includes, a substrate, one or more routing layers, and an active shield layer. The substrate includes active devices. The routing layers are electrically connected to the active devices and are configured to route electrical signals to and from the active devices. The active shield layer is disposed within a routing layer nearest to the substrate, the active-shield layer includes metallic traces configured to conduct active-shield signals that provide an indication of an attack on the apparatus.

In some embodiments, a combined footprint of the active devices and the metallic traces of the active shield layer interposes between the attack and any of the electrical signals in the routing layers. In other embodiments, at least some of the active devices, and corresponding sections of the active shield layer, are laid out in a plurality of standard cells. In yet other embodiments, the routing layers are configured to route the electrical signals to and from the standard cells.

In an embodiment, the sections of the active shield layer of at least two of the standard cells are electrically connected to one another. In another embodiment, the active shield layer is electrically isolated from the active devices and from the routing layers. In yet another embodiment, the apparatus includes interconnecting traces, which are configured to electrically connect between one or more of the active devices and one or more of the routing layers.

In some embodiments, the interconnecting traces and the active shield layer are fabricated in a same layer, and are electrically disconnected from one another. In other embodiments, the apparatus includes protection circuitry, which is connected to the metallic traces of the active-shield layer and is configured to detect the attack based on the active-shield signals.

There is additionally provided, in accordance with an embodiment of the present invention, a method for designing an electronic apparatus, the method includes, holding a library of standard cells, each of at least a subset of the standard cell that includes, a substrate including active devices, one or more routing layers, which are electrically connected to the active devices and route electrical signals to and from the active devices, and an active shield layer, which is laid out within a routing layer nearest to the substrate, the active shield layer includes metallic traces, which conduct active-shield signals that provide an indication of an attack on the apparatus. The apparatus is designed using one or more of the standard cells drawn from the library.

There further provided, in accordance with an embodiment of the present invention, a method for producing an electronic apparatus, the method includes forming active devices on a substrate. One or more routing layers, which are electrically connected to the active devices, are disposed. An active shield layer, which includes metallic traces that conduct active-shield signals that provide an indication of an attack on the apparatus, is disposed within a routing layer nearest to the substrate.

The present invention will be more fully understood from the following detailed description of the embodiments thereof, taken together with the drawings in which:

DETAILED DESCRIPTION OF EMBODIMENTS

Overview

Figure 1:
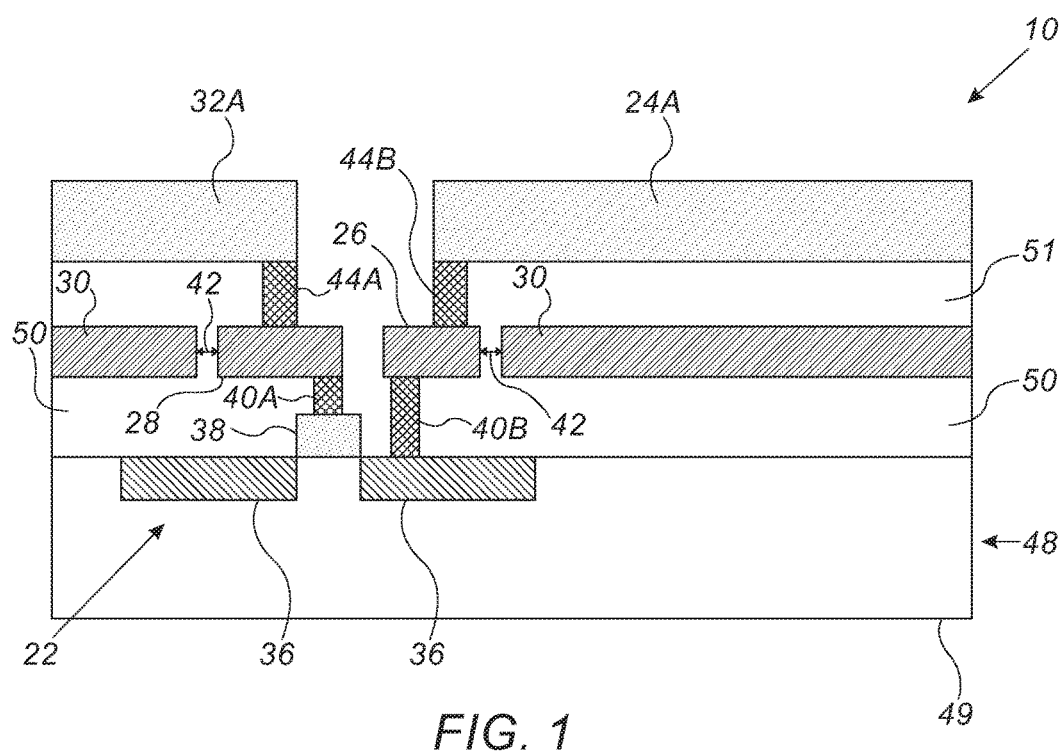
FIG. 1 is a schematic, sectional view illustration of an Integrated Circuit (IC), in accordance with an embodiment of the present invention.

Integrated Circuits (ICs) may be subject to data security attacks in which an unauthorized party attempts to access (e.g., read, modify or erase) confidential information in the IC or to inject faults therein. For example, an attacker may direct a Focused Ion Beam (FIB), or an electron or laser beam, to a predefined location on the IC, attempting to penetrate into internal layers of the IC.

ICs that are designed in accordance with deep submicron (e.g., less than 100 nm) design rules, typically comprise multiple (e.g., 3-12) layers of metal interconnects, which are laid on a substrate (e.g., silicon) and patterned with density. These metal layers (also referred to as "routing layers") are sometimes effective in blocking attacks applied to the upper side of the IC. In principle, the IC can also be protected by adding a shield on its top surface.

(In the present context, the terms "top side" and "upper side" refer to the surface of the IC that is furthest away from the substrate on which the IC is fabricated. Similar, the terms "bottom side," "lower side" and "backside" refer to the substrate side of the IC. As such, these terms are not related to the actual orientation of the IC in space, e.g., when mounted in some host assembly or system.)

In some cases, an attacker may carry out the attack through the substrate at the backside of the IC. Such attacks are referred to as "backside attacks." For example, in flip-chip pack techniques, the top side of the IC faces the Printed Circuit Board (PCB) of the host electronic system. In this configuration, it is difficult to access the top side, but the backside of the IC is exposed to attacks through the substrate.

An attacker may carry out a backside attack, for example, by directing a FIB to filler cells located between standard cells of the IC, and forming an interconnect to the standard cell through which the attacker may modify the IC functionality or inject faults into the IC. Other forms of backside attacks are also possible.

Embodiments of the present invention that are described herein below provide improved techniques for protecting an IC against backside attacks using an active shield layer. In some embodiments, the active shield layer is disposed within one of the routing layers, such as the first rouging layer (referred to herein as "metal 1"), disposed nearest to the substrate of the IC. In an embodiment, the active shield layer comprises metallic traces, which are designed as part of an existing metal 1 layer of the standard cells used for designing the IC. As such, the IC can be designed and produced using existing design and production tools and flows.

In this embodiment, in addition to the active shield traces, the metal layer typically comprises short interconnections that connect active devices of the IC, such as transistors, to higher routing layers. With this design, the combined footprint of the active devices and the active-shield traces fully interpose between the attack and electrical signals in the higher routing layers metal 2 and above). As such, a backside attack on signals in the higher routing layers of the IC is highly likely to be blocked and/or detected by the active shield layer and/or by the active devices of the IC.

The disclosed techniques protect ICs against backside attacks using an active shield that does not require additional design or production steps, and does not significantly increase the associated production costs of the IC. Furthermore, the disclosed techniques enable adding the active-shielding capabilities with little or no increase in the size of the standard cell, and the total size of the IC.

System Description

FIG. 1 is a schematic, sectional view illustration of an Integrated Circuit (IC) 10, in accordance with an embodiment of the present invention. In various embodiments, IC 10 stores and/or exchanges sensitive information, and is protected against backside attacks that attempt to access such information. IC 10 may serve, for example, as a security chip, such as a security controller that provides security services to a host or any other electronic device and/or system.

In some embodiments, IC 10 comprises a substrate 48, located at the backside of IC 10 and made from silicon or from any other suitable materials. Active devices, such as a transistor 22, are typically formed on the upper surface of substrate 48. Transistor 22 is a schematic example of an active device, simplified for the sake of clarity. In other embodiments, the techniques described herein may be applicable to any other type of active devices, such diodes, power transistors, memory cells such as a three-dimensional (3D) NAND, fin-FET transistors, and many others.

In an embodiment, transistor 22 comprises a source and a drain, referred to as S/D 36, and a gate 38. S/D 36 are typically formed by implanting ions into substrate 48 so as to form electrical charge carriers therein.

In some embodiments, one or more pillars of conductive interconnects, such as contacts 40A and 40B, are configured to conduct functional electrical signals to and from transistor 22, via silicide layers (not shown) that serve as an interface between contacts 40 and transistor 22.

In some embodiments, IC 10 comprises multiple routing layers. A first routing layer, referred to as metal 1, is the routing layer nearest to substrate 48. The metal layer comprises electrically conductive materials, such as copper and/or aluminum alloys, and is configured to conduct the functional electrical signals to and from transistor 22 via contacts 40A and 40B.

In some embodiments, metal 1 comprises short routing traces 28 and 26, which are configured to exchange the functional electrical signals with gate 38 and S/D 36, via contacts 40A and 40B, respectively. In other embodiments, contacts 40A and 40B, and traces 28 and 26, may be connected to gate 38 and/or S/D 36 using any other suitable connectivity configuration.

In some embodiments, IC 10 comprises a second routing layer, referred to as "metal 2". Metal 2 layer comprises routing traces 32A and 24A made from an electrically conductive material, such as copper, and are configured to conduct the functional electrical signals to and from traces 28 and 26, via conductive interconnects, such as contacts 44A and 44B, respectively. Note that the conductive interconnects between the metal layers (e.g., contacts 44A and 44B), may be also referred to as "vias" or "plugs."

Protecting a Standard Cell of the IC Against Backside Attacks

In some cases, an attacker may carry out a backside attack on IC 10, for example by directing a Focused Ion Beam (FIB) that penetrates IC 10 through a lower surface 49 of substrate 48. The FIB physically modifies the routing traces (e.g., traces 28 and 26) of IC 10, and in this manner the attacker can modify the functionality of IC 10, probe from outside or force from outside an internal net, e.g., access information stored in IC 10 and/or inject operational faults or cause functional changes in IC 10 that may benefit the attacker.

In some embodiments, the metal 1 layer further comprises metallic traces 30, which are configured to serve as an active-shield layer of IC 10. In an embodiment, traces 30 are electrically isolated from routing traces 28 and 26 by spaces 42 located therebetween.

In some embodiments, IC 10 comprises dielectric layers 50 and 51, made from dielectric materials such as silicon oxide or any other suitable material. In an embodiment, dielectric layer 50 is configured to electrically isolate between the traces of metal 1 (e.g. traces 26, 28 and 30) and transistors 22 of substrate 48. Similarly, dielectric layer 51 is disposed between metal 1 and metal 2, and is configured to electrically isolate therebetween.

In an embodiment, layer 50, layer 51 or both are further configured to electrical isolate between traces 26, 28, and 30. For example, spaces 42 are patterned in metal 1 and filled with layer 51, so as to isolate between the routing traces (e traces 26 and 28) and traces 30 of the active-shield.

In another embodiment, traces 26, 28 and 30 may fill respective trenches etched in layers 50 and/or 51. This embodiment provides electrical isolation between traces 26, 28 and 30.

Typically, a minimal effective diameter of a circuit-editing FIB spot on a surface of IC 10 is on the order of 10-20 nanometers (nm). The positioning accuracy of the beam on the surface is on the order of additional 30-40 nm. Furthermore, adding limitation of a metallization of such holes along a typical thickness of a sill on wafer (e.g., 750-800 µm) may result in a minimal effective width of an interconnection formed by the FIB, to an order of 100 nm.

In some embodiments, the width of space 42 is smaller than the effective interconnection formed by the FIB or an effective spot size of any other beam used for a backside attack. With this design, a FIB impinging on any location on surface 49 will hit either an active device (e.g., S/D 36 or gate 38) or a trace of the active shield (trace 30). In other words, the combined footprint of the active devices and (ii) the active-shield traces, fully interposes between the signals routed in metal 2 layer (e.g., routing traces 26, 28, 24A and 32A) and any possible FIB spot. Thus, an attempt of backside attack, even through spaces 42, may be blocked or detected by transistors 22 and/or by traces 30. These embodiments require the attacker to apply methods that are complicated and/or expensive, thereby, improving the protection of IC 10.

In some embodiments, traces 30 are configured to conduct active-shield electrical signals to and from protection circuitry (not shown) so as to provide an indication of the attack on IC 10.

In some embodiments, the active-shield electrical signals are digital signals conducted, for example, in eight parallel active-shield traces 30 across IC 10. In these embodiments, the protection circuitry drives predefined test signals at a first end of the traces, and checks, at a second end of the traces, whether the predefined test signals are detected properly. In other embodiments, the protection circuitry drives analog pulses at the first end of traces 30, and checks electrical characteristics (e.g., latency of the corresponding pulses detected at the second end.

The active shield layer and its functionality are depicted in more details in FIG. 2 below.

In some embodiments, the traces of metal 1 and metal 2 of IC 10 conduct two types of signals as described herein. Routing traces 28 and 26 of metal 1, and routing traces 32A and 24A of metal 2, are configured to conduct functional electrical signals that may convey confidential information, and are used for the operation of IC 10. Traces 30 of metal 1, are configured to conduct active-shield electrical signals, which are different from the functional electrical signals, and are conducted in an active-shield channel that is electrically isolated from a functional channel of IC 30. In some embodiments, spaces 42 that are with dielectric layers 50 and/or 51, are configured to electrically isolate between the functional electrical signals and the active-shield electrical signals.

As noted above, a FIB impinging on substrate 48 will hit either transistor 22 or active-shield traces 30. In either case, the attack is likely to be detected and mitigated. If the FIB hits transistor 22, the interaction between the FIB and the transistor causes an immediate change to the electronic characteristics of transistor 22 (e.g., changes threshold voltages, or causing a complete malfunctioning).

In an embodiment, IC 10 identifies this change as caused by an external intervention, and transmits a corresponding signal to the protection circuitry. The protection circuitry in turn takes protective measures such as shutting-off selected operations or functions of IC 10, erasing memory content, and/or outputting a notification of a suspected attack. In another embodiment, IC 10 may comprise a logic built-in self-test (FIST) hardware, which is configured, during power up sequence, to detect changes in a significant portion of transistors 22 of IC 10, caused by the attack. Furthermore, a large number of transistors 22 are essential for implementing the functionality of IC 10. Therefore, IC 10 may become non-functional in case of a damage caused to one or more transistors 22.

If the FIB hits any of the active-shield traces 30, the interaction between the FIB and trace 30 is identified by the protection circuitry itself, which triggers the above-described protective measures.

Figure 2:
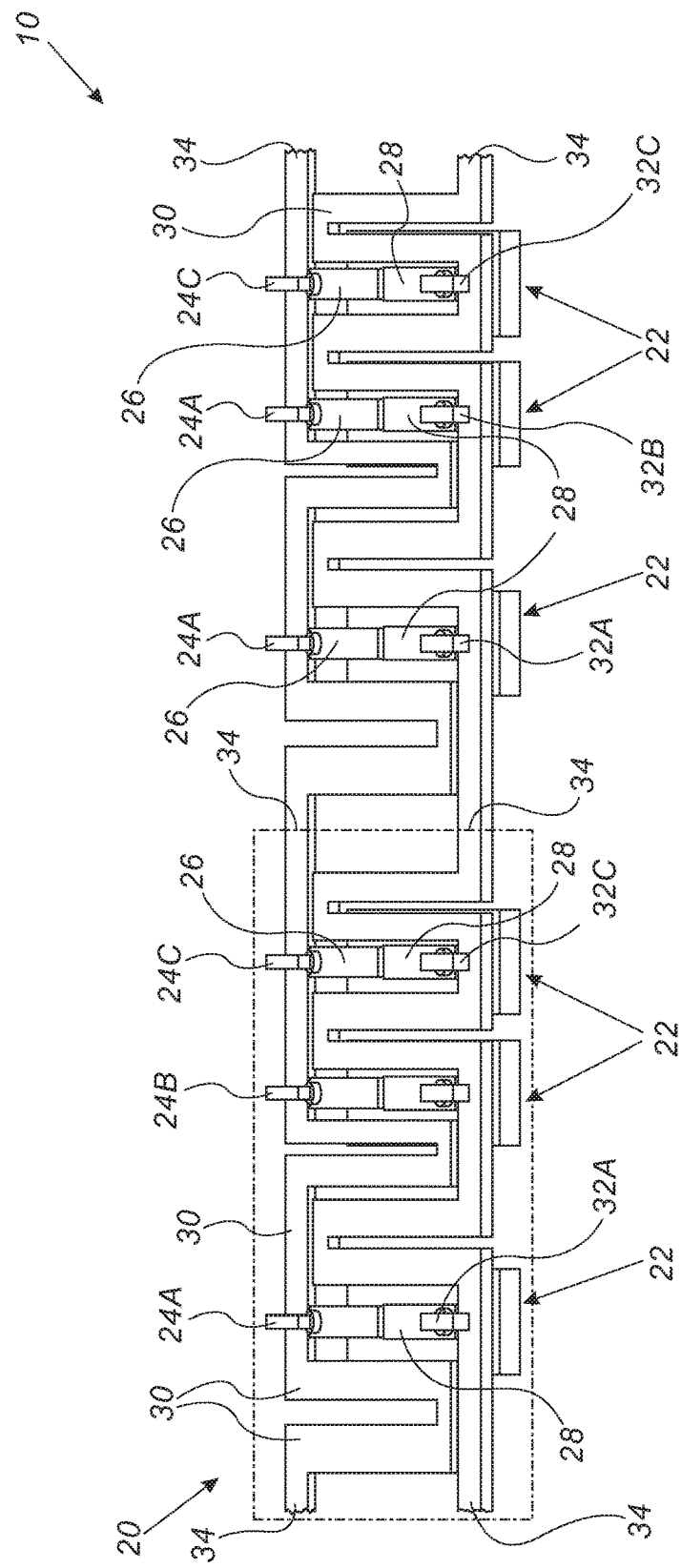
FIG. 2 is a schematic, top view illustration of standard cells having an integrated active shield, in accordance with an embodiment of the present invention.

FIG. 2 is a schematic, top view illustration of two standard cells 20 of IC 10, in accordance with an embodiment of the present invention. In the example of FIG. 2, substrate 48 and the dielectric and metal layers (except for metal 1 and part of metal 2) are not shown, for the sake of clarity.

In the present context, the term "standard cell," (also referred to as "library cell") refers to a basic predefined building block of electronic circuitry that is used by the IC designer. In a typical design process, the designer selects suitable standards cells from a predefined library and places them in a suitable layout on the substrate. Subsequently, the designer specifies the appropriate routing of signals to and from the standard cells.

Each standard cell may comprise one or more active devices, one or more passive devices, and/or one or more interconnections. A given standard cell implements some basic building-block functionality, such as a memory element, a Flip-Flop, a logic gate, or other suitable element.

In some embodiments, IC 10 comprises a plurality of standard cells 20. In some embodiments, standard cells 20 are laid out in any suitable configuration, such as an array comprising a large number (e.g., millions) of cells 20, in which a filler cell (not shown) separates between neighbor standard cells.

In the disclosed embodiments, each standard cell 20 has a layered structure as shown in FIG. 1 above. In particular, each standard cell 20 comprises one or more sections of active-shield traces 30 in metal 1 layer. As seen in the figure, when standard cells 20 are placed next to one another, the sections of active-shield traces 30 of neighboring cells 20 connect to one another, so as to conduct the active-shield signals across IC 10 as a whole.

In the example of FIG. 2, each standard cell 20 comprises three transistors 22. The left transistor, whose sectional view is depicted in FIG. 1, is interconnected to traces 24A and 32A of metal 2 layer. Similarly, the transistor located in the middle is interconnected to traces 24B and 32B of metal 2, and the transistor located on the right is interconnected to traces 24C and 32C of metal 2.

In an embodiment, traces 24A, 24B, 24C, 32A, 32B, and 32C of metal 2 conduct only functional electrical signals, of which at least some signals carry confidential data. As described in detail in FIG. 1, the traces of metal 2 exchange the signals with transistors 22, via traces 26 and 28 of metal 1, and contacts 40A, 40B, 44A and 44B.

In an embodiment, the length and width of traces 26 and 28 are minimal (subject to the design rules of IC 10) so as to reduce the exposure of the functional electrical signals to possible backside attacks, as described above. In this embodiment, the functional electrical signals are routed within the metal 2 layer and possibly via higher layers of metal (e.g., metal 3), which are located between metal 2 and the topside of IC 10.

In some embodiments, IC 10 may comprise an additional active or passive shield on its upper surface, for protection against topside attacks. In these embodiments, the functional electrical signals routed within the metal 2 layer and the higher metal layers, are protected against both topside and backside attacks.

Protecting Against Backside Attacks Between the Standard Cells

In some cases, the attacker may carry out the backside attack by directing a FIB onto one or more filler cells (not shown) that are located between standard cells 20. The FIB in such an attack is applied to form interconnect between at least some of the routing traces of standard cell 20 and an external circuitry that the attacker uses for carrying out the attack.

In some embodiments, traces 30 of the active shield layer are laid out across standard cell 20 in a dense pattern, and interpose between any apparatus used for the backside attack and any of the functional electrical signals conducted in the traces metal 2 and the higher metal layers, whereas transistors 22 interpose between the attack and traces 26 and 28.

In some embodiments, the width of the space between neighbor traces 30 is on an order of width of space 42 (shown in FIG. 1), which is smaller than the effective interconnection formed by the FIB, or an effective spot size (on the bottom surface of traces 30) of any other type of beam that may be used in a backside attack.

In an embodiment, traces 30 of neighbor standard cells 20 are electrically connected to one another at connecting positions 34. In this embodiment, traces 30 are interconnected between some or all standard cells 20, and are configured to conduct the active-shield electrical signals within each standard cell 20 as well as between standard cells 20, e.g., in the filler cells.

In another embodiment, traces 30 are laid out at any suitable pattern, for example, across the entire area of IC 10.

In some embodiments, the techniques describes above are implemented during the design of IC 10. For example, a designer of IC 10 may select (e.g., from a library stored in a memory of a design workstation) and place one or more standard cells 20. In an embodiment, each standard cell in the library comprises a section of substrate 48, one or more transistors 22, contacts 40A, 40B, 44A and 44B, routing traces such as traces 26 and 28 of metal 1, and traces of metal 2 and additional metal layers, and section of traces 30 of metal 1 that serve as part of the active-shield layer.

In some embodiments, the production flow of IC 10 may comprise the following steps: at a first step, the active devices, such as transistors 22, are formed on substrate 48. At a second step, the metal 1 layer that comprises traces 26, 28, and 30 is formed on layer 50, as will be described below.

In an embodiment, traces 26 and 28 are used solely for routing the functional electrical signals, whereas active-shield traces 30 are used solely for conducting the active-shield electrical signals. Note that traces 26, 28 and 30 are formed in the same metal 1 layer (and therefore the same process steps), but are electrically isolated from one another, by using any suitable Very Large Scale Integration (VLSI) production techniques.

At a third step, additional metal layers, such as traces 24A and 32A of metal 2, are produced, e.g., on layer 51 as will be described below. In an embodiment, these traces are used solely for routing the functional electrical signals of IC 10.

In some embodiments, dielectric layers, such as layers 50 and 51, and contacts 40A, 40B, 44A, and 44B are formed between the first and second steps, and between the second and third steps. In an embodiment, the dielectric layers are configured to electrically isolate between the metal layers, as well as, between the individual pattern features of transistors 22, and neighboring metal layers. The contacts are configured to interconnect between transistor 22, metal 1 and metal 2 at preselected locations so as to form the desired paths for routing the respective electrical signals.

In these embodiments, layer 50 and contacts 40A and 40B are produced after producing transistor 22 (at the first step) and before producing metal 1 (at the second step), and layer 51 and contacts 44A and 44B are produced after producing metal 1 (at the second step) and before producing metal 2 (at the third step).

Note that the design and production flows described above for producing IC 10 that is protected from backside attacks, use the same or similar steps required to design and produce a conventional IC that does not have an active or passive shield layer. Traces 30 are added in the design stage of IC 30 as part of the standard cells. Therefore, producing the active shield layer does not significantly increase the production costs of IC 10 and does not modify the design process. Furthermore, the disclosed techniques enable adding the active-shield capabilities without significantly increasing the size of the standard cell, and/or of the total size of IC 10.

Figure 3:
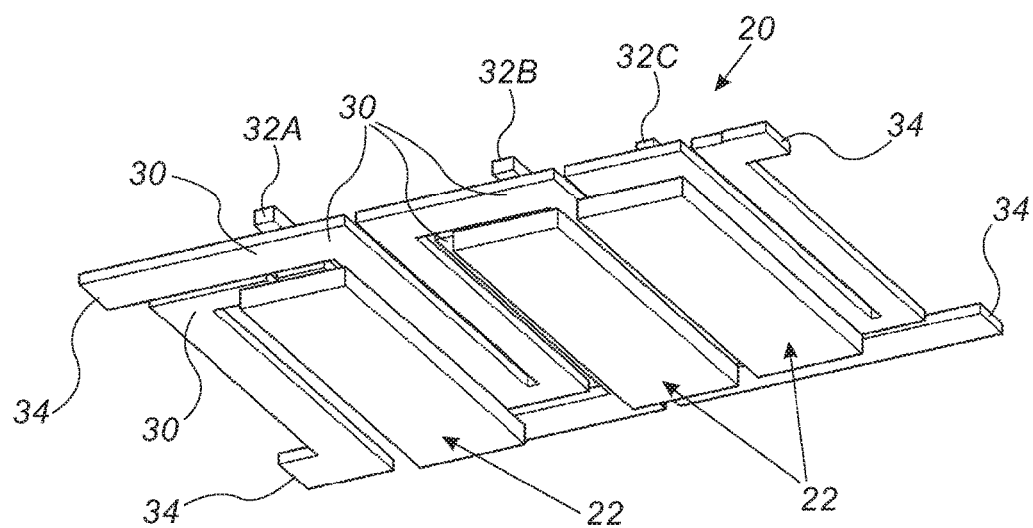
FIG. 3 is a schematic, perspective bottom view illustration of an active shield integrated in a standard cell, in accordance with an embodiment of the present invention.

FIG. 3 is a schematic, perspective bottom view illustration of standard cell 20, in accordance with an embodiment of the present invention. In the example of FIG. 3, substrate 48 and the dielectric and metal layers (except for metal 1 and part of metal 2) are omitted from the figure for the sake of clarity. FIG. 3 shows a perspective from which the FIB (or any other beam) is directed onto surface 49 (shown in FIG. 1) during an attempt to carry out a backside attack on IC 10.

As shown in FIG. 3, transistors 22 and traces 30 interpose between the FIB and the traces of the routing layers (e.g., traces 26 and 28) that conduct the functional electrical signals. In some embodiments, routing layers of the functional electrical signals, such as traces 32A, 32B and 32C shown in FIG. 3, are obstructed from the FIB by transistors 22 and/or traces 30 of the same standard cell 20 or of a neighbor standard cell 20 (not shown).

In an embodiment, traces 30 of neighbor standard cells 20 are electrically connected to one another at connecting positions 34 so as to form a contiguous active shield layer across multiple cells 20 and to interpose between the FIB and the filler cells as described above.

The embodiments described above focus mainly on ICs that are used for data security applications. The configuration of IC 10 in FIGS. 1-3 is simplified and depicted purely by way of example, for demonstrating an example device in which one or more active-shield layers and/or a passive shield layers may be integrated and used for protecting any IC from a backside attack. Alternatively, any other suitable configurations can also be used.

Although the embodiments described herein mainly address security microcontrollers for personal computers, the methods and systems described herein can also be used in other applications, such as in controllers of any electronic apparatus, Integrated circuits that manage Digital Right Management (DRM) for preventing unauthorized use and/or copy of original media, for example, in DVD and game consoles, black-boxes of vehicles, engine control units (ECU), printers to enforce use of genuine ink/toner, tablets and internet-of-things (IoT) sensors.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic apparatus, comprising:
   a substrate comprising active devices;
   one or more routing layers, which are electrically connected to the active devices and are configured to route electrical signals to and from the active devices;
   an active shield layer, which is disposed within a routing layer nearest to the substrate, wherein the active shield layer comprises metallic traces configured to conduct active-shield signals that provide an indication of an attack on the apparatus; and
   protection circuitry, which is connected to the metallic traces of the active-shield layer and is configured to drive the active-shield signals and to detect the attack based on the active-shield signals.

2. The apparatus according to claim 1, wherein a combined footprint of the active devices and the metallic traces of the active shield layer interposes between any possible spot on the substrate that is subject to the attack and any of the electrical signals in the routing layers.

3. The apparatus according to claim 1, wherein at least some of the active devices, and corresponding sections of the active shield layer, are laid out in a plurality of standard cells.

4. The apparatus according to claim 3, wherein the routing layers route the electrical signals to and from the standard cells.

5. The apparatus according to claim 3, wherein the sections of the active shield layer of at least two of the standard cells are electrically connected to one another.

6. The apparatus according to claim 1, wherein the active shield layer is electrically isolated from the active devices and from the routing layers.

7. The apparatus according to claim 1, and comprising interconnecting traces, which electrically connect between one or more of the active devices and one or more of the routing layers.

8. The apparatus according to claim 7, wherein the interconnecting traces and the active shield layer are fabricated in a same layer, and are electrically disconnected from one another.

* * * * *